United States Patent [19]
Adachi et al.

[11] Patent Number: 6,091,139
[45] Date of Patent: Jul. 18, 2000

[54] SEMICONDUCTOR DEVICE

[75] Inventors: Masaki Adachi, Yokohama; Isao Ogawa, Kitakyushu, both of Japan

[73] Assignee: Kabushiki Kaisha Toshiba, Kawasaki, Japan

[21] Appl. No.: 08/938,998

[22] Filed: Sep. 26, 1997

[30] Foreign Application Priority Data

Oct. 1, 1996 [JP] Japan .................................. 8-260820
Aug. 28, 1997 [JP] Japan .................................. 9-232392

[51] Int. Cl.⁷ .................................................. H01L 23/48
[52] U.S. Cl. ........................... 257/690; 257/666; 257/674; 257/676
[58] Field of Search ..................................... 257/690, 666, 257/676, 674, 678, 779

[56] References Cited

U.S. PATENT DOCUMENTS

| | | | |
|---|---|---|---|
| 4,912,544 | 3/1990 | Onuki et al. | 257/738 |
| 5,844,308 | 12/1998 | Dedert et al. | 257/779 |
| 5,889,317 | 3/1999 | Huang et al. | 257/676 |

FOREIGN PATENT DOCUMENTS

6-283645  10/1994  Japan .

*Primary Examiner*—Michael Trinh
*Assistant Examiner*—Roy Potter
*Attorney, Agent, or Firm*—Oblon, Spivak, McClelland, Maier & Neustadt, P.C.

[57] ABSTRACT

A semiconductor device comprising a package formed of a thermoplastic resin, first and second lead frames arranged parallel to each other with a predetermined space interposed therebetween, and each having a distal end portion of a predetermined length located in the package, solder films formed on the first and second lead frames from outside the package to inside the package, a semiconductor element mounted on the distal end portion of the first lead frame and having an electrode, and a bonding wire having an end connected to the electrode of the semiconductor element, and another end connected to the distal end portion of the second lead frame.

10 Claims, 7 Drawing Sheets

TABLE 1

| TEST RESIN | 1 | 2 | 3 | 4 | 5 | 6 | 7 | 8 | 9 | 10 | 11 | 12 |
|---|---|---|---|---|---|---|---|---|---|---|---|---|
| d1 (mm) | -1.0 | -0.1 | 0.2 | 0.3 | 0.5 | 0.5 | 0.6 | 0.7 | 0.9 | 0.5 | 0.5 | 12 |
| d2 (mm) | 0.8 | 0.8 | 0.8 | 0.7 | 0.5 | 0.3 | 0.4 | 0.3 | 0.1 | 0.5 | 0.5 | 0.5 |
| t2 (mm) | 20 | 20 | 20 | 20 | 20 | 20 | 20 | 20 | 20 | 10 | 50 | 100 |
| DISTANCE OF MOISTURE ENTERING (mm) | 2.0 | 2.0 | 1.5 | 1.2 | 0.5 | 0.5 | 0.5 | 0.7 | 1.5 | 1.5 | 0.5 | 0.5 |

SEMICONDUCTOR DEVICE

BACKGROUND OF THE INVENTION

This invention relates to a semiconductor device with a semiconductor element (such as a photo semiconductor used for detecting a substance, for optical communication, for optical fiber communication, or as a photo coupler) sealed with a resin, and a method for manufacturing the semiconductor device.

There is a photo semiconductor device, in which a photo semiconductor element (such as a light emitting semiconductor element or a light receiving semiconductor element) is mounted on a carrier member such as a lead frame or a TAB (tape automated bonding) tape, the carrier member with the photo semiconductor element is contained in the cavity of a die, and the cavity with the carrier member and the semiconductor element is filled with a resin, thereby forming a sealed package. In general, an epoxy resin, which is a thermosetting resin, is used as a filling resin for avoiding cracks.

Figure 8:
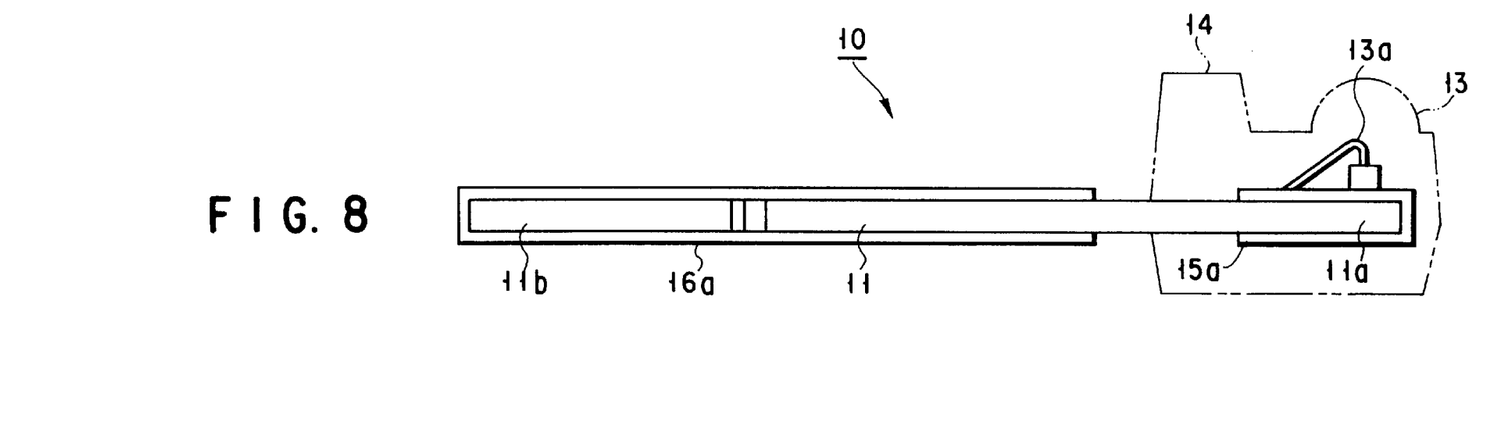
FIG. 8 is a side view, showing the conventional photo semiconductor device.
Figure 9A:
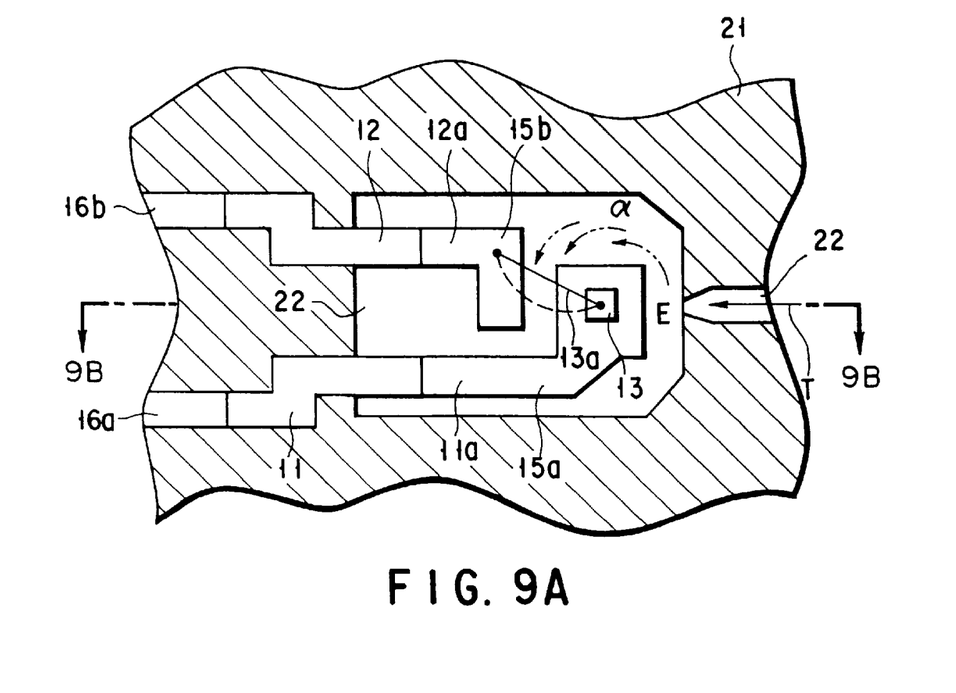
FIG. 9A is a plan view of a mold for producing the conventional semiconductor device, showing a state in which a lead frame is mounted on a lower mold component.
Figure 9B:
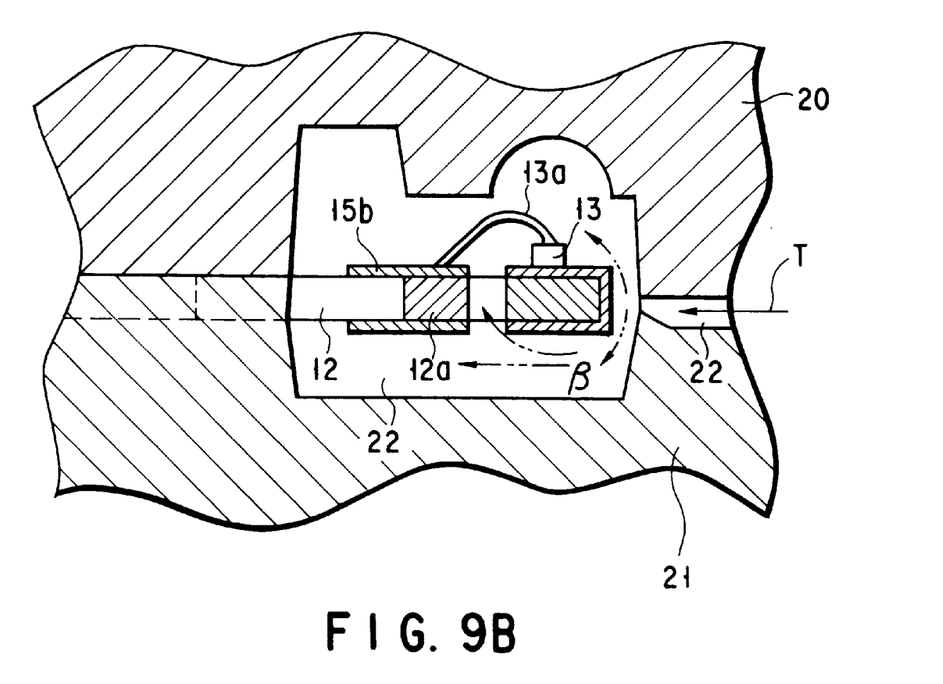
FIG. 9B is a sectional view, taken along lines X—X of FIG. 9A.

FIGS. 8, 9A and 9B show a photo semiconductor device 10 as an example of a semiconductor device of this type. The photo semiconductor device 10 comprises a first lead frame 11 with a thickness of about 0.4 mm, a second lead frame 12 with a thickness of about 0.4 mm, a semiconductor element 13 with a thickness of 300–400 µm, square in shape(0.28 mm×0.28 mm), attached to the first lead frame 11, and a package member 14 sealing the first and second lead frames 11 and 12 and the semiconductor element 14. Reference numerals 15a and 15b denote silver films with a thickness of about 10 µm, and reference numerals 16a and 16n solder films with a thickness of about 20 µm. Each solder film 16a is separated by about 1 mm from the package member 14.

The photo semiconductor device 10 is manufactured by the following process. Distal end portions 11a and 12a of the first and second lead frames 11 and 12 are beforehand plated with silver to thereby form the silver films 15a and 15b.

Then, the first lead frame 11 with the semiconductor element 13 mounted thereon, and the second lead frame 12 are put in a cavity 22 defined by upper and lower mold components 20 and 21. The semiconductor element 13 is connected to the second lead frame 12 by an aurum bonding wire 13a. Subsequently, an epoxy resin T as a thermosetting resin is injected into the cavity through a gate 22. Thereafter, the solder films 16a and 16b are formed in a dip process in which proximal end portions 11b and 12b of the first and second lead frames 11 and 12 are dipped in a solder bath.

The epoxy resin is widely used since it shows a high fluidity when it is molded, and a high adhesion to the first and second lead frames 11 and 12 after it is hardened. However, about 180 seconds are required to harden the thermosetting resin such as the epoxy resin requires after molding, which will result in a low productivity and may cause a burr.

To shorten the time required for hardening and increase the productivity, it is considered to use a thermoplastic resin as the sealing resin. The thermoplastic resin is useful in increasing the productivity, since it will be hardened in only about 10 seconds.

However, the following problems will occur when the cavity 22 is filled with the thermoplastic resin to seal the semiconductor element 13.

First, the thermoplastic resin shows a lower adhesion to the lead frames than the epoxy resin. Therefore, moisture cannot completely be prevented from entering the device through the boundaries of the first and second lead frames and the package member 14. Thus, the resulting device has a low moisture tolerance.

Second, in the dip process using solder, it is possible that the package member 14 will be contaminated with solder, that a lower portion of the package 14 will be softened by the heat of solder and then deformed due to its own weight, or that moisture contained in the resin will be converted into bubbles as a result of evaporation.

Last, when the first and second lead frames 11 and 12 are coated with a flux by dipping, etc. to facilitate the forming of the solder films, the flux will enter the interior of the semiconductor device through the boundaries of the first and second lead frames 11 and 12 and the package member 14, thereby contaminating the semiconductor element 13 and reducing the reliability of the device.

On the other hand, when the cavity is filled with the sealing resin, the resin will flow around the bonding wire 13a in directions indicated by arrows α and β in FIGS. 9A and 9B. This being so, the bonding wire 13a will greatly be deformed due to the flow resistance of the sealing resin, if the thermoplastic resin, which has a high viscosity, is used as the sealing resin. In particular, the flow in the direction α will greatly deform the bonding wire 13a, with the result that the wire 13a may well be cut or be brought into contact with the first lead frame 11. Thus, it is difficult to impart a sufficient reliability to the photo semiconductor device.

Japanese Patent Application KOKAI Publication No. 6-283645 discloses a case where the overall surface of the lead frame is coated with an epoxy resin-based conductive paste. In this case, however, it is possible that the moisture permeating the paste outside the package (the epoxy resin has a high hygroscopicity) will corrode the bonding portion of the lead frame which is located within the package. If, in this case, a solder film is formed on the overall surface of the lead frame in place of the conductive paste, bonding cannot be performed.

BRIEF SUMMARY OF THE INVENTION

The present invention has been developed under the above-described circumstances, and aims to provide a semiconductor device with a high moisture tolerance and hence a high reliability although it employs a thermoplastic resin as a sealing material of a semiconductor element incorporated therein, and also to provide a method for manufacturing the semiconductor device.

According to an aspect of the invention, there is provided a semiconductor device comprising: a package formed of a thermoplastic resin; first and second lead frames arranged parallel to each other with a predetermined space interposed therebetween, and each having a distal end portion of a predetermined length located in the package; solder films formed on the first and second lead frames from outside the package to inside the package; a semiconductor element mounted on the distal end portion of the first lead frame and having an electrode; and a bonding wire having an end connected to the electrode of the semiconductor element, and another end connected to the distal end portion of the second lead frame.

Since in this structure, the solder films are formed from outside of the package of a thermoplastic resin to inside the package, the thermoplastic resin is tightly adhered to the solder films. This adhesion is stronger than that of the thermoplastic resin to the lead frames. Accordingly, moisture is prevented from entering the package from the outside. Further, since the thermoplastic resin has a lower hygroscopicity than the thermosetting resin, the amount of moisture which enters the semiconductor element from the resin itself is smaller.

According to another aspect of the invention, there is provided a method of manufacturing a semiconductor device, comprising the steps of: forming solder films on first and second lead frames, arranged parallel to each other with a predetermined space interposed therebetween, over a predetermined length from proximal end portions of the first and second lead frames; bonding a semiconductor element on a distal end portion of the first lead frame; connecting a terminal of the semiconductor element to a distal end portion of the second lead frame by a wire; and sealing, with a thermoplastic resin, the distal end portions of the first and second lead frames and those end portions of the solder films which are opposite to the proximal end portions of the first and second lead frames and near the distal end portions of them.

Since in the method of the invention, the solder films are formed before the package of the thermoplastic resin is formed, the package is prevented from being adversely influenced by the heat generated at the time of forming the solder films. As a result, deformation or degradation of the package is avoided.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

The embodiments of the invention will be described with reference to the accompanying drawings.

Figure 1:
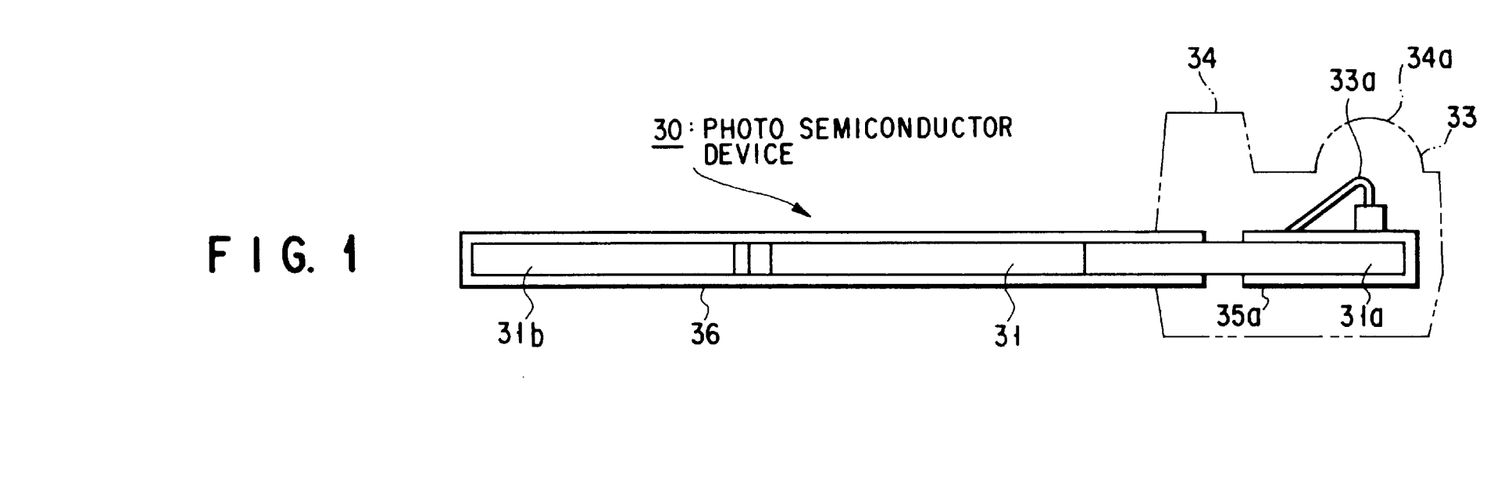
FIG. 1 is a side view, showing a photo semiconductor device according to a first embodiment of the invention.
Figure 2A:
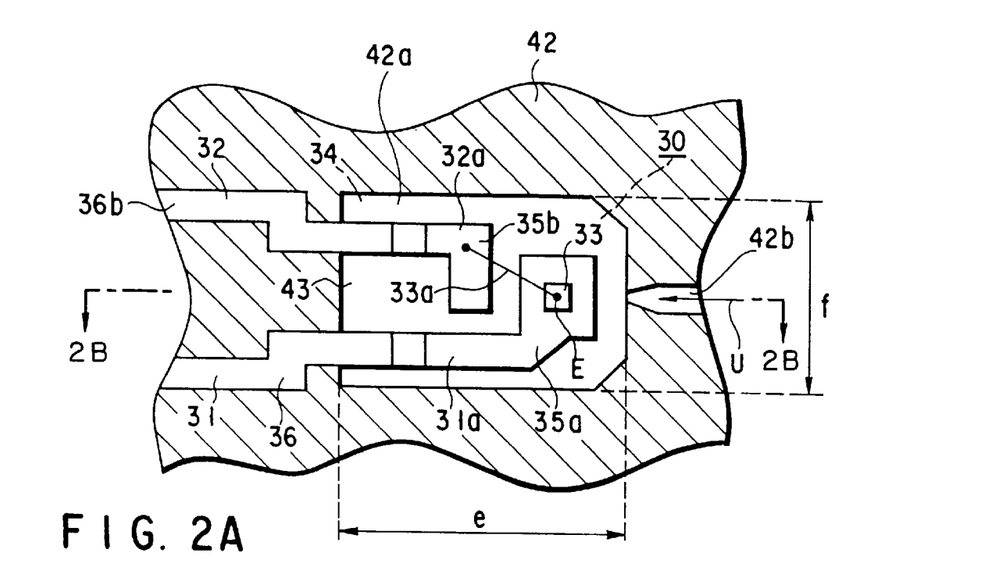
FIG. 2A is a plan view of a mold for producing the semiconductor device of FIG. 1, showing a state in which a lead frame is mounted on a lower mold component.
Figure 2B:
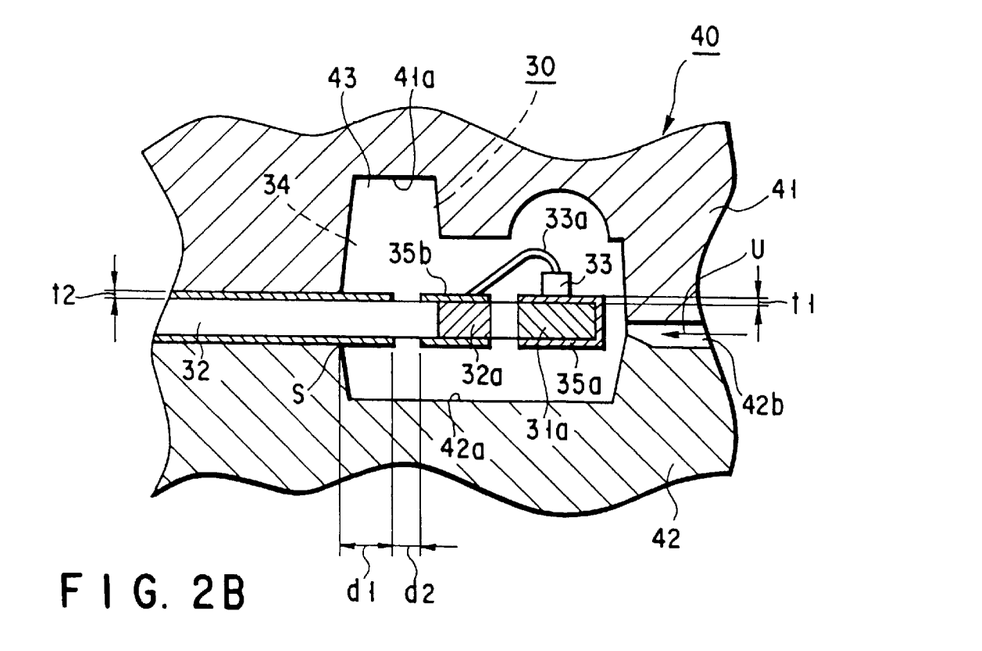
FIG. 2B is a sectional view, taken along lines A—A of FIG. 2A.

FIG. 1 is a side view, showing a photo semiconductor device 30 according to a first embodiment of the invention, and FIGS. 2A and 2B show a mold 40 for producing the semiconductor device 30. The photo semiconductor device 30 is an internal element SSV (small side view) in a position-detecting interrupter.

As is shown in FIGS. 1, 2A and 2B, the photo semiconductor device 30 comprises a first lead frame 31, a second lead frame 32, a light-emitting semiconductor element 33 attached to the first lead frame 31, and a package member 34 sealing the first and second lead frames 31 and 32 and the light-emitting semiconductor element 34. The package 34 has a lens portion 34a. Although in FIG. 2B, the lens portion 34a is formed semispherical, it may be formed flat.

Silver films 35a and 35b with a thickness of about 10 μm are formed, over predetermined regions, on a distal end portion 31a of the first lead frame 31 and a distal end portion 32a of the second lead frame 32, respectively.

The light-emitting semiconductor element 33 has its anode-side terminal connected to the distal end portion 31a of the first lead frame 31, and its cathode-side terminal connected to the distal end portion 32a of the second lead frame 32 via the electrode E of the element 33 and a bonding wire 33a.

Solder films 36a and 36b with a thickness of about 20 μm are formed over the predetermined areas of the first and second lead frames 31 and 32, which extend from the proximal end portions 31b and 32b to inside the package member 34, respectively. The composition of each of the solder films 36a and 36b is Sn:Pb=90:10.

As shown in FIG. 2A, the package member 34 has a length e of about 4 mm and a length f of about 3 mm, and is formed by hardening a thermoplastic resin which is transparent or coated in black to shade visible light (when the device is used as a light-receiving semiconductor device, the resin is coated in black to shade light with a wavelength of 750 nm or less).

Referring to FIG. 2B, the mold 40 comprises an upper mold component 41 and a lower mold component 42. The upper and lower mold components 41 and 42 have concave portions 41a and 42a for defining a cavity 43 used to form the package member 34 of the photo semiconductor device 30. The lower mold component 42 has a gate 42b through which a resin is injected into the cavity from the outside.

The photo semiconductor device 30 is manufactured in the following manner. In the initial solder film forming process, predetermined regions of the proximal end portions 31b and 32b of the first and second lead frames 31 and 32 are plated with solder to thereby form the solder films 36a and 36b. Since at this time, the package member 34 is not yet formed, there is no fear of deformation or degradation of the package member due to the heat.

In the next silver film forming process, predetermined regions of the distal end portions 31a and 32a of the first and second lead frames 31 and 32 are plated with silver to thereby form the silver films 35*a* and 35*b*.

The distal ends of the solder films 36*a* and 36*b* are to be located inside the package member 34 such that they are separated from the boundary reference position S of the package member 34 by 0.5 mm (as indicated by d1 in FIG. 2B) and from the silver films 35*a* and 35*b* by 0.3 mm (as indicated by d2 in FIG. 2B), respectively.

The reason why the solder films 36*a* and 36*b* are separated from the silver films 35*a* and 35*b* by at least 0.3 mm will be explained. Since the solder films 36*a* and 36*b* are formed after the silver films 35*a* and 35*b*, the solder films 36*a* and 36*b* are formed while the portions of the first and second lead frames which should not be plated with solder are masked. If, however, the distance between the solder films and the silver films is too small, a solder flux or a solder solution will enter a clearance between the frames and masked portions, thereby contaminating the silver films. The contaminated silver films adversely affects the chemical reaction of gold and silver at the time of bonding, with the result that neither necessary bonding strength nor sufficient reliability can be obtained.

Further, in the case where the solder films 36*a* and 36*b* are in contact with the silver films 35*a* and 35*b*, Sn will separate from solder and reach the silver films 35*a*, 35*b* and even the bonding wire 33*a* when moisture enters the device. When Sn reaches the bonding wire 33*a*, the portion of the bonding wire 33*a* which is in contact with the silver film 35*b* will corrode, with the result that the bonding wire 33*a* will peel off the silver film 35*b* and hence the device will be defective.

Figure 3A:
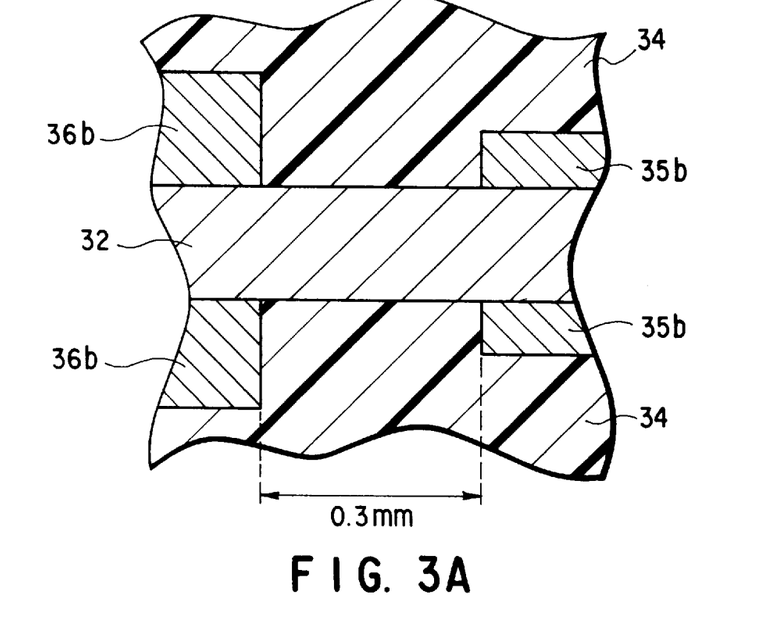
FIGS. 3A and 3B are sectional views, showing an essential part of the photo semiconductor device of FIG. 1.
Figure 3B:
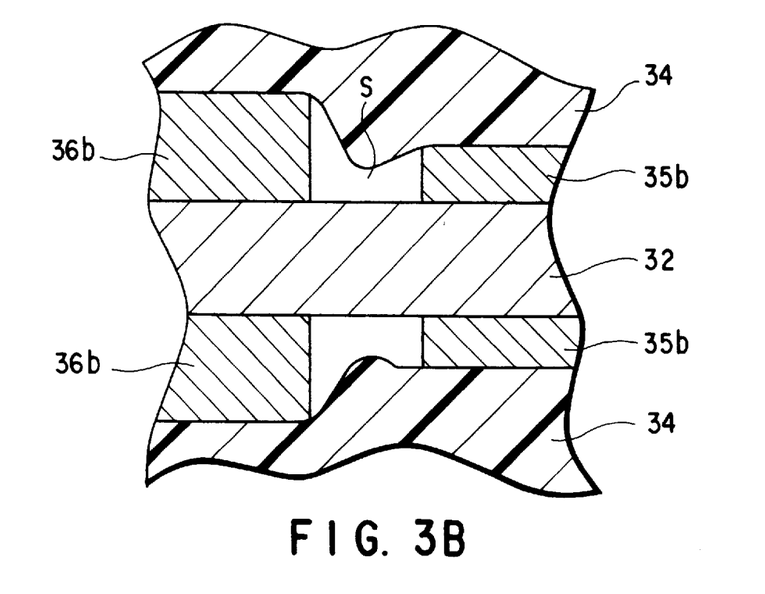

Moreover, where the solder films 36*a* and 36*b* are separated from the silver films 35*a* and 35*b* by 0.3 mm or more, the gaps therebetween are sufficiently filled with the thermoplastic resin as shown in FIG. 3A, thereby preventing entering of moisture. If, on the other hand, they are not sufficiently separated from each other, the gaps are not sufficiently filled with the thermoplastic resin, thereby defining spaces S therebetween as shown in FIG. 3B. As a result, moisture may easily enter the device through the spaces S.

A method for setting the positions of the solder films 36*a*, 36*b* and the silver films 35*a*, 35*b* will be described later.

Thereafter, the anode-side terminal of the light-emitting semiconductor element 33 is bonded to the distal end portion 31*a* of the first lead frame 31, and the cathode-side terminal of the element 33 to the distal end portion 32*a* of the second lead frame 32 via the bonding wire 33*a*. Although the first and second lead frames are heated up to about 165° C. at the time of the connection, the solder films 36*a* and 36*b* will not melt since the melting point of solder is about 200° C.

Lastly, the package member 34 is molded by injection molding. The molding conditions are: the temperature of the mold: 130° C.; the melting point of the resin: 350–360° C.; the appearing viscosity of the resin when passing the gate: 300 Pa.s; and pressure: 120 MPa. Further, a functional norbornen resin, which is included in polyolefin resins and has a molecular weight of 80000, a tensile elongation modulus of 12%, and a glass transition point of 165° C., was used as the thermoplastic resin. The average molecular weight was measured by high speed liquid chromatography (HLC) (temperature: 38° C.; flow rate: 1.0 m l/min.) using toluene as a solvent, and calculated by polystyrene conversion. Further, the tensile elongation modulus was measured on the basis of tensile test JISK7113.

The package 34 is molded by filling the cavity 43 with the thermoplastic resin through the gate 42*b* after placing the first and second lead frames 31 and 32 in the cavity 43. The thermoplastic resin hardens in about 10 seconds. At this time, the surfaces of the portions of the solder films 36*a* and 36*b*, which are located in the cavity 43, once melt because of the heat of the thermoplastic resin flowing therein, and harden when the thermoplastic resin cools down to 200° C. or less. On the other hand, the thermoplastic resin is in the melted state until its temperature lowers to 165° C. In other words, the thermoplastic resin hardens after solder hardens, which means that the resin can be adhered to solder without any clearance therebetween. Since, thus, the adhesion of the thermoplastic resin to solder is greater than that of the resin to the lead frames, moisture can not easily enter the device through the boundaries of the lead frames and the package member.

The solder films are melted by the heat in the mold. The amount of heat in the mold is based on the total of the temperature of the mold and that of the resin. In the embodiment, the heat generated when the mold temperature is set at 130° C. and the resin temperature at 350–360° C. causes melting of only surface portions of the solder films with a thickness of 20 μm, and does not change the thickness.

If the solder composition of the solder films 36*a* and 36*b* is set to, for example, Sn:Pb=70:30, the melting point of solder becomes 183° C., which means that the solder films 36*a* and 36*b* are melted by the thermoplastic resin.

Figure 4:
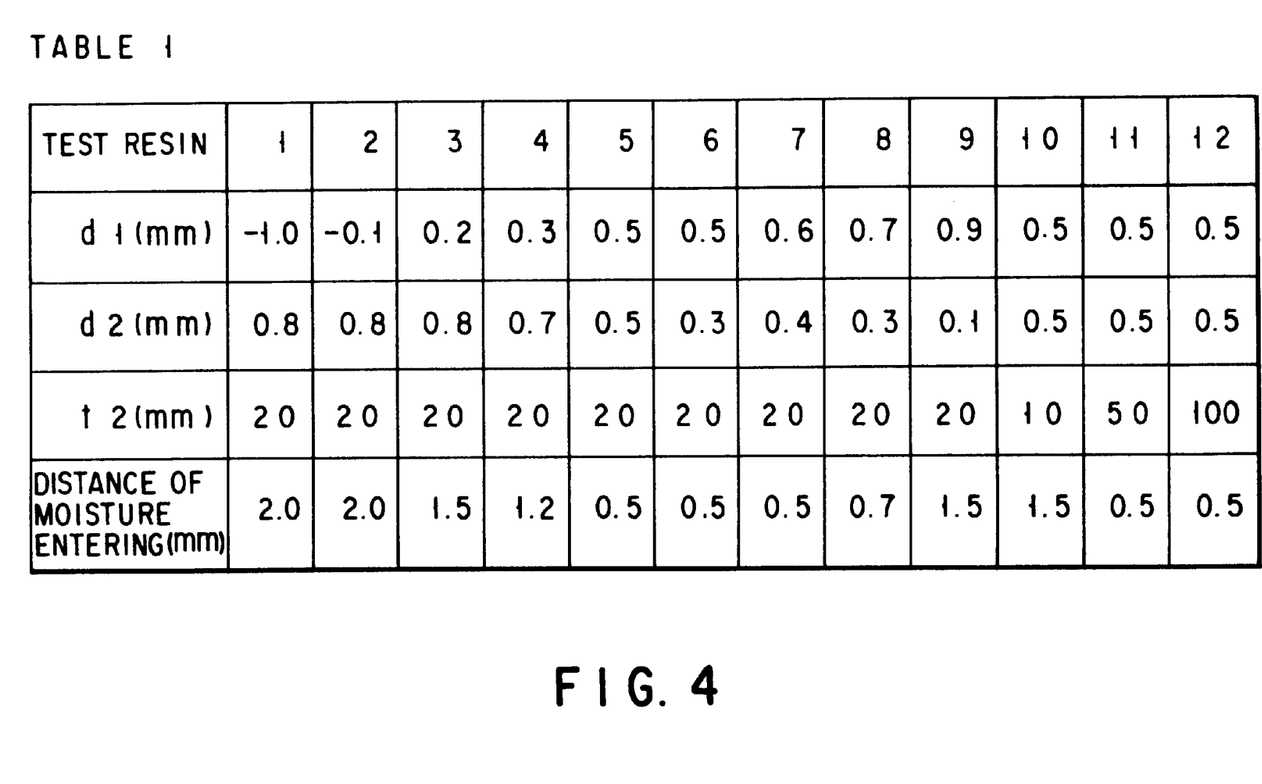
FIG. 4 is a table, showing results of red ink permeation tests.

Table 1 of FIG. 4 shows the results of red ink entering tests for estimating to what degree the photo semiconductor device 30 is sealed by the package member 34. In these tests, ten types of test resin packages, wherein those portions of the solder films 36*a* (36*b*) which are contained in the packages have different lengths, were prepared and subjected to performance estimation.

Moreover, in the tests, photo semiconductor devices 30 incorporating the ten types of resin packages were dipped in red ink for fountain pens for 24 hours, and the distance was measured, over which the red ink enters the boundaries of the lead frames and the thermoplastic resin of each of the resin packages. Reference signs d1, d2, t2 in the table denote the sizes shown in FIG. 2B. The distance of red ink entering indicates a distance from the boundary reference position S in FIG. 2B. The case where the value of d1 is negative indicates that no portions of the solder films 36*a* and 36*b* are formed in the resin package. Further, d2 is a value obtained by subtracting d1 from 1 mm.

The test results show that the distance over which the red ink is present is minimum where the portion of each of the solder films which is contained in the resin package is 0.5 mm or more (d1≧0.5 mm), and the solder films are separated from the silver films by at least 0.3 mm (d2≧0.3 mm).

As described above, in the photo semiconductor device 30 according to the first embodiment of the invention, even if the thermoplastic resin which shows a low adhesion to the lead frames is used as the sealing resin to shorten the time required for hardening the resin and increase the productivity, the entering of moisture can be minimized. Moreover, since the thermoplastic resin shows a lower absorption of water than the epoxy resin, the amount of moisture from the thermoplastic resin is small. Thus, the semiconductor device can be sufficiently protected from moisture, and hence can have a high reliability.

Furthermore, since the solder film forming process can be performed before the package forming process, the package can be prevented from deformation or degradation due to the heat generated in the solder dipping process. Thus, a highly reliable semiconductor device can be produced at a high efficiency.

In addition, even where a flux is coated by dipping, etc. to facilitate the forming of the solder films, the entering of the flux can be prevented, thereby preventing contamination of the semiconductor device and accordingly increasing the reliability of the device.

Figure 5:
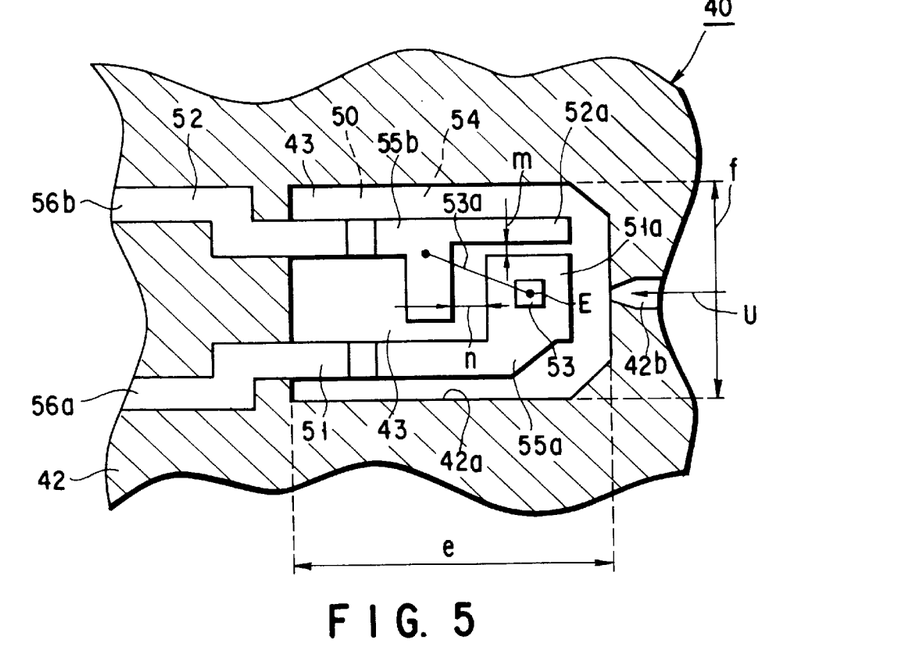
FIG. 5 is a plan view, showing a state in which a lead frame is mounted on a lower mold component of a mold for producing a photo semiconductor device according to a second embodiment of the invention.

FIG. 5 shows a mold 40 for producing a photo semiconductor device 50 according to a second embodiment of the invention. In FIG. 5, elements similar to those in FIGS. 2A and 2B are denoted by corresponding reference numerals, and no description will be given thereof.

The photo semiconductor device 50 comprises a first lead frame 51, a second lead frame 52, a light-emitting semiconductor element 53 attached to the first lead frame 31, and a package member 54 sealing the first and second lead frames 51 and 52 and the light-emitting semiconductor element 53.

Silver films 55a and 55b with a thickness of about 10 μm are formed, over predetermined regions on a distal end portion 51a of the first lead frame 51 and a distal end portion 52a of the second lead frame 52, respectively.

The light-emitting semiconductor element 53 has its anode-side terminal connected to the distal end portion 51a of the first lead frame 51, and its cathode-side terminal connected to the distal end portion 52a of the second lead frame 52 via the electrode E of the element 53 and a bonding wire 53a.

Solder films 56a and 56b with a thickness of about 20 μm are formed over the predetermined areas of the first and second lead frames 51 and 52, which extend from the proximal end portions 51b and 52b to inside the package member 54, respectively. The composition of each of the solder films 56a and 56b is Sn:Pb=90:10.

As shown in FIG. 5, the distal end portion 51a of the first lead frame 51 and the distal end portion 52a of the second lead frame 52 are both substantially L-shaped, and opposed to each other such that a clearance m therebetween is narrower than a clearance n therebetween. The distal end portions 51a and 52a with the configurations and the positional relationship shown in FIG. 5 serve as regulation means for regulating the flow of the resin.

Preferably, the clearance m is set at 0.1–0.2 mm, and the clearance n at 0.4 mm or more.

In the package member 54, a length e is set at about 4 mm, and a length f at about 3 mm.

The photo semiconductor device 50 is manufactured in the same manner as the above-described photo semiconductor device 30. When the resin is filled into the cavity through the gate 42b, its flow rate is restrained by the flow regulation means since the clearance m is narrower than the clearance n. More specifically, the flow of the resin into a space between the first and second lead frames 51 and 52 is restricted at the clearance m, and accordingly the flow of the resin from the concave portion 42a of the lower mold component 42 to the concave portion 41a of the upper mold component 41 through the clearance n is prevailing. Since this flow is prevailing around the bonding wire 53a, the deformation amount of the bonding wire is lower by 80% than the conventional case. It should be noted that in this embodiment, the time required for hardening the thermoplastic resin is about 10 seconds.

The above-described second embodiment can provide similar advantages to those obtained by the first embodiment, and also the advantage that deformation of the bonding wire 53a can be restrained even when a thermoplastic resin of a high viscosity is used as a filling material, thereby further enhancing the reliability of the device.

Figure 6:
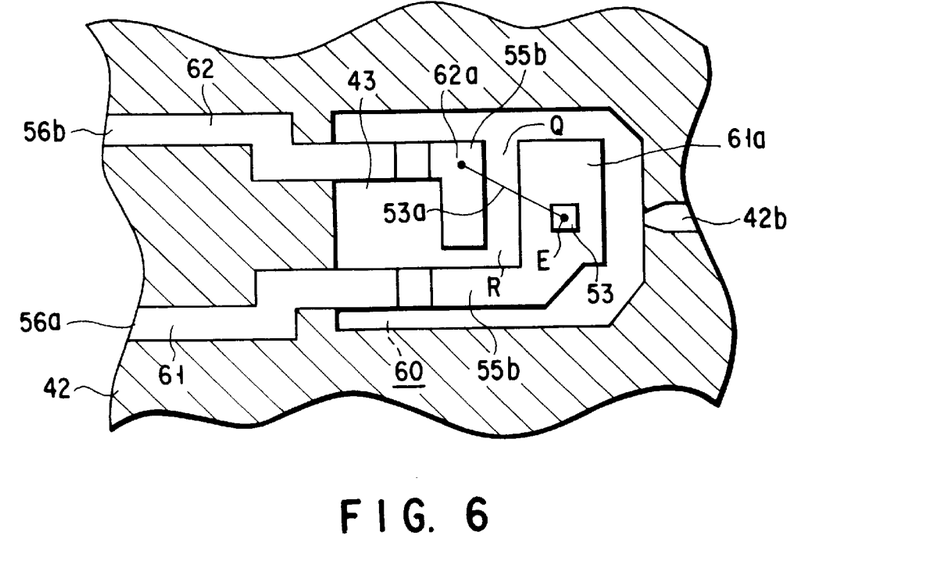
FIG. 6 is a plan view, showing a state in which a lead frame is mounted on a lower mold component of a mold for producing a photo semiconductor device according to a third embodiment of the invention.

FIG. 6 shows a mold for forming a photo semiconductor device 60 according to a third embodiment of the invention. In FIG. 6, elements similar to those in FIG. 5 are denoted by corresponding reference numerals, and no description will be given thereof.

The third embodiment differs from the second embodiment in that a clearance Q between a distal end portion 61a of a first lead frame 61 and a distal end portion 62a of a second lead frame 62 is arranged at an angle of 90° or more to the gate 42b. The combination of the lead frames 61 and 62 serves as regulation means for regulating the flow of the resin.

Also in the case of the photo semiconductor device 60 of the third embodiment, the resin does not easily flow through the clearance Q but prevailingly flows through a clearance R, which enables the device 60 to provide similar advantages to those of the photo semiconductor device 50.

Figure 7:
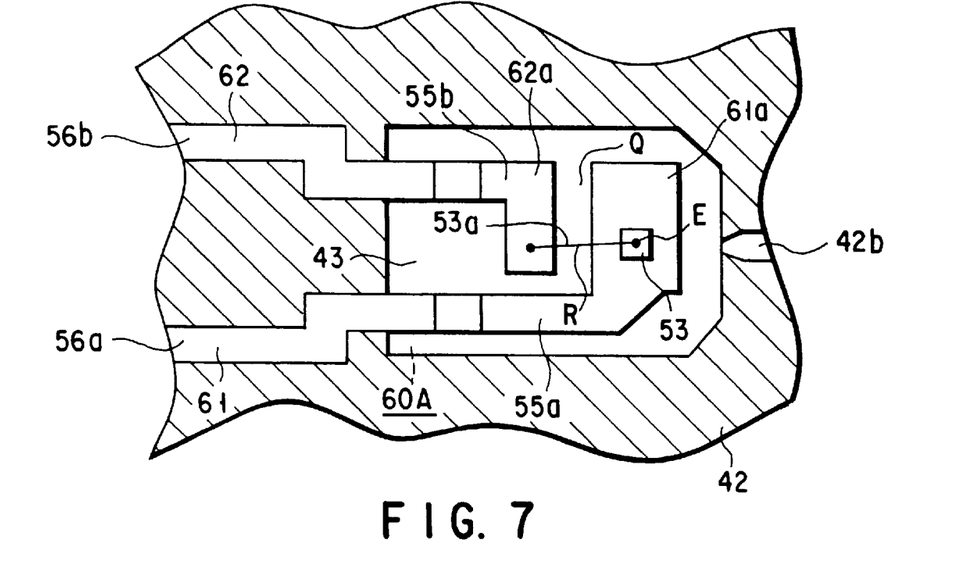
FIG. 7 is a plan view, showing a state in which a lead frame is mounted on a lower mold component of a mold for producing a photo semiconductor device according to a modification of the third embodiment of the invention.

FIG. 7 shows a mold for forming a photo semiconductor device 60A as a modification of the third embodiment of the invention. In FIG. 7, elements similar to those in FIG. 6 are denoted by corresponding reference numerals, and no description will be given thereof.

This modification differs from the third embodiment in the portion of the second lead frame 62 connected to the bonding wire 53a. In this modification, the bonding wire 53a is located substantially parallel to the line of the leftward flow of the resin introduced into the cavity 43 through the gate 42b. By virtue of this structure, the deformation amount of the bonding wire 53a can be minimized.

The invention is not limited to the above-described embodiments. Although in the embodiments, the solder films and the silver films are formed by plating, a dipping method may be used in place of the plating method. Further, the composition of solder may be modified in accordance with the melting point of a thermoplastic resin used or the mold temperature. Moreover, a light-receiving semiconductor element may be employed in the photo semiconductor device in place of the light-emitting semiconductor element. It is a matter of course that the invention can be modified in various manners without departing from its scope.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a package comprising a thermoplastic resin;
   first and second lead frames separated by a space, each having a length located in the package;
   a first and second solder films formed on the first and second lead frames, respectively, said first and second solder films extending from outside the package to inside the package;
   a first metallic film formed on a portion of the first lead frame located inside the package;
   a second metallic film formed a on portion of the second lead frame located inside the package;
   a semiconductor element mounted on the first metallic film and having an electrode; and
   a bonding wire having an end connected to the electrode of the semiconductor element and having another end connected to the second metallic film, wherein the first solder film is separated from the first metallic film by a distance in the package, and the second solder film is separated from the second metallic film by a distance in the package.

2. The device according to claim 1, wherein the distances separating the first and second solder films from the first and second metallic films, respectively, are not less than 0.3 mm.

3. The device according to claim 1, wherein a portion of each of the first and second solder films, located inside the package, has a length of not less than 0.5 mm.

4. The device according to claim 1, wherein the first and second solder films have a thickness of at least 20 $\mu$m.

5. The device according to claim 1, wherein the package includes a regulation mechanism configured to regulate a thermoplastic resin flow through a clearance defined between end portions of the first and second lead frames.

6. A semiconductor device comprising:

a package comprising a thermoplastic resin;

first and second lead frames separated by a space, each having a length located in the package;

a first and second solder films formed on the first and second lead frames, respectively, said first and second solder films extending from outside the package to inside the package;

a photo semiconductor element mounted on the first lead frame and having an electrode; and a bonding wire having an end connected to the electrode of the semiconductor element and having another end connected to the second lead frame.

7. The device according to claim 6, wherein a portion of each of the first and second solder films, located inside the package, has a length of not less than 0.5 mm.

8. The device according to claim 6, wherein the first and second solder films have a thickness of at least 20 $\mu$m.

9. The device according to claim 6, further comprising:

a first metallic film formed on a portion of the first lead frame inside the package; and a second metallic film formed on a portion of the second lead frame inside the package, wherein the first solder film is separated from the first metallic film by a distance in the package, and the second solder film is separated from the second metallic film by a distance in the package.

10. The device according to claim 6, wherein the package includes a regulation mechanism configured to regulate a thermoplastic resin flow through a clearance defined between end portions of the first and second lead frames.

* * * * *